United States Patent [19]

Fry

[11] 4,114,087

[45] Sep. 12, 1978

[54] MAGNETIC OR ELECTRIC MEASURING DEVICES

[75] Inventor: Michael George Joseph Fry, Old Coulsdon, England

[73] Assignee: Brentford Electric Limited, Crawley, England

[21] Appl. No.: 733,476

[22] Filed: Oct. 18, 1976

[51] Int. Cl.$^2$ ............................................. G01R 33/08
[52] U.S. Cl. ............................ 324/0.5 E; 324/0.5 MA
[58] Field of Search ......... 324/0.5 R, 0.5 MA, 0.5 H, 324/0.5 E, 47, 43 G

[56] References Cited

U.S. PATENT DOCUMENTS

| | | | |
|---|---|---|---|
| 3,114,103 | 12/1963 | Serson | 324/0.5 E |
| 3,199,021 | 8/1965 | Anderson | 324/0.5 MA |
| 3,495,163 | 2/1970 | Salvi | 324/0.5 E |
| 3,501,690 | 3/1970 | Salvi et al. | 324/0.5 E |
| 3,559,045 | 1/1971 | Robach et al. | 324/0.5 E |

Primary Examiner—M. Tokar
Attorney, Agent, or Firm—Daniel M. Rosen

[57] ABSTRACT

Apparatus for measuring magnetic field strength which comprises two Nuclear Magnetic Resonance cells (the NMR cells), a field generator for applying to the NMR cells bias magnetic field which is parallel and of substantially equal strength at each NMR cell, an excitation assembly for separately magnetically exciting each NMR cell at its own Larmor precession, or resonance, frequency, and a device for deriving a signal in accord with the difference between the Larmor frequencies of the two cells. When the NMR cells further receive test magnetic field which is of substantially equal strength at each NMR cell and which is parallel to, and at one cell is in the same direction, and at the other cell is in the opposite direction to, the bias field at the respective NMR cells, resultant magnetic fields of strengths equal to the sum and difference of the stengths of the bias and test fields will be experienced by the one and the other NMR cell respectively, and it is shown that the difference signal derived indicates the magnitude of the test field.

18 Claims, 11 Drawing Figures

MAGNETIC OR ELECTRIC MEASURING DEVICES

FIELD OF THE INVENTION

This invention relates to improvements in magnetic or electric measuring devices and in particular to devices employing the phenomenon of Nuclear Magnetic Resonance (NMR) for the measurement of magnetic field strength.

BACKGROUND TO THE INVENTION

A brief description of the theoretical basis of this application of the said phenomenon will first be given.

Most atomic nuclei possess angular momenta together with associated magnetic dipole moments. Consider such a nucleus to be sited at the origin of a set of three mutually orthogonal co-ordinate axes, X, Y, and Z. Let the nucleus be subject to a static unidirectional magnetic field of strength, $B_x$, directed along the X-axis and an alternating magnetic field of peak strength, $B_y$, directed along the Y-axis. In the absence of either magnetic field, no significant component of the other field is detectable in a direction parallel to the Z-axis. In the presence of both fields however, it will be found with suitable apparatus of known art, that for every value of the field strength, $B_x$, there is at least one frequency, F, of the alternating field, $B_y$, at which Nuclear Magnetic Resonance occurs. The resonance is characterized by a sharp increase in the absorption of energy at the frequency, F, along the Y-axis, and by the simultaneous emission of energy at the frequency, F, along the Z-axis.

The frequency, F, is called the Larmor Precession or Resonance frequency and its ratio to the field strength, $B_x$, for an isolated nucleus is constant. This ratio, $\gamma = F/B_x$ is shown as the Magnetogyric (or Gyromagnetic) Constant for the nucleus and is sensibly independent of environmental ambient conditions of pressure, temperature, etc. Its value $\gamma$ for certain nuclei has been determined to a high order of precision. The constants for Hydrogen and Lithium, for example, are:

$\gamma_H = 4257.76$ Hz/Gs and $\gamma_{Li} = 1654.61$ Hz/Gs respectively.

The nuclei to be resonated may constitute part of the molecules of a liquid, or of a solid dissolved in a liquid, contained in a small glass enclosure (the NMR cell) which is surrounded by the coils necessary for the excitation and detection of the magnetic fields, $B_x$, $B_y$ and $B_z$. In certain circumstances, the said liquid medium may be replaced by a solid medium.

DESCRIPTION OF THE PRIOR ART

Before proceeding to a description of the purpose and nature of the present invention, two alternative methods of measuring the Larmor frequency according to known art, will first be described, with reference to FIGS. 1 and 2 of the accompanying drawings, wherein:

FIG. 1 illustrates apparatus for the detection of nuclear magnetic resonance by absorption of RF energy, and FIG. 2 illustrates apparatus for the detection of nuclear magnetic resonance by emission of RF energy.

According to FIG. 1 apparatus for detection of N.M.R. by RF energy absorption may comprise a set of coils 1,2 with paired supply conductors 7, carrying an electric current, which causes the coils to generate a steady magnetic field, $B_x$, substantially parallel in direction to the axis of symmetry of the coils, X—X'.

An NMR cell, 3, comprising a small sealed glass phial containing distilled water, is mounted midway between coils 1,2 at the intersection of the axis of symmetry of the coils, X—X', and a second orthogonal axis, Y—Y'. The protons forming the nuclei of the hydrogen content of the distilled water are the subject of the NMR to be excited and detected. The cell 3 is surrounded by a coil 4 which has its axis of symmetry co-incident with the axis Y—Y', and which is connected by paired conductors, 8, to one arm of an R. F. Wheatstone bridge having four impedance arms comprising the coil 4, an inductor L and two capacitors C,C'.

The bridge is excited by a RF oscillator 5, connected to the bridge input terminals 9,10. The bridge output terminals 11,12 are connected to any suitable type of RF detector 6. The oscillator 5 and detector 6 are caused to sweep over a range of frequencies large enough to include the Larmor frequency which it is required to detect. At all frequencies except the said Larmor frequency, the cell 3 behaves as a sensibly non-magnetic body and coil 4 as an air cored coil of constant resistance and inductance. The Wheatstone bridge may thus be balanced at all frequencies in the swept range for which these conditions apply, by a single predetermined choice of values of L,C and C'.

At the Larmor frequency however, the protons in the cell 3 display NMR and absorb RF energy. This unbalances the Wheatstone bridge and excites the RF detector 6.

Alternatively, as shown in FIG. 2, NMR may be detected by RF emission. Coils 1,2 and 4 with paired conductors 7,8, and NMR cell 3 have the same positions and functions as in the FIG. 1 arrangement. RF oscillator 5 is however directly connected to coil 4 via the leads 8. Two additional coils, 13 and 14 are mounted close to the cell 3 with their axis of symmetry Z—Z', intersecting the axes X—X', and Y—Y' orthogonally. They are electrically connected by paired conductors, 15, to the RF detector, 6.

At all frequencies except the Larmor frequency, the cell 3 remains inert to RF energy and no signal is detected by detector 6 because of the orthogonality of the coil axes Y—Y' and Z—Z'. At the Larmor frequency however, the protons contained within cell 3 absorb RF energy along the axis Y—Y' and reradiate it, at the same frequency in all directions, including the direction of the axis Z—Z', thus causing a signal to be detected by detector, 6.

In both the apparatus of FIG. 1 and of FIG. 2, the required NMR Larmor frequency is the frequency of the signal appearing at the detector 6.

When employed in the measurement of a magnetic field strength either of the two apparatuses described above is arranged so that the test field constitutes the steady field, $B_x$. One major limitation of either of these methods of measuring magnetic field strength derives from the dependence of the sensitivity of the measurement upon the value of the magnetic field strength, $B_x$, to which it is related by a quadratic law. Thus, the signal-to-noise ratio of a conventional NMR instrument which may be adequate for relatively large values of the field, $B_x$, is seriously degraded at some lower value of the said field and is unacceptably small at values of $B_x$ approaching zero. The range of measurement of typical NMR instruments, is from 100% to 33% of the nominal operation field strength.

OBJECT OF THE INVENTION

The principle object of the present invention is to circumvent this limitation and to extend the accuracy of measurement of NMR techniques to an instrument covering a wide range of measurable values, including the zero value. As described below, further incidental benefits flow from the invention, including the feasibility of extending NMR measuring techniques into areas of electrical metrology which have hitherto been closed to this approach.

SUMMARY OF THE INVENTION

According to the invention apparatus is provided for measuring the strength of a test magnetic field (the 'test field'), comprising two Nuclear Magnetic Resonance cells (the NMR cells); field generating means for applying to the NMR cells bias magnetic field which is parallel and of substantially equal strength at each NMR cell, such that when the NMR cells further receive test magnetic field which is of substantially equal strength at each NMR cell and which is parallel to, and at one NMR cell is in the same direction, and at the other NMR cell is in the opposite direction to, the bias field at said respective NMR cells, resultant magnetic fields of strengths equal to the sum and difference of the strengths of the bias and test fields will be experienced by said one and said other NMR cell respectively; means for separately magnetically exciting each NMR cell at its own Larmor precession, or resonance, frequency; and means for deriving a signal in accord with the difference between the Larmor frequencies of the two NMR cells.

The derived signal may be alternating at the frequency corresponding to the said difference frequency and further means may be provided to convert this alternating signal into an equivalent analogue or digital coded form.

The bias field should be of a strength greater than that of any possible value of the test field.

The theory underlying the operation of the invention may be simply described as follows:

| Let the strength of the bias field be | $B_b$ Gauss |
| the strength of the test field be | $B_t$ Gauss |
| the resonant frequency of the NMR cell experiencing the sum of bias and test fields be | $F_1$ Herz |
| the resonant frequency of the NMR cell experiencing the difference between bias and test fields be | $F_2$ Herz |
| the Magnetogyric constant of the relevant nucleus be | $\gamma$ Herz/ Gauss |

Then
$$F_1 = \gamma (B_b + B_t) \quad (1)$$

$$F_2 = \gamma (B_b - B_t) \quad (2)$$

Whence
$$(B_t) = (F_1 - F_2)/2\gamma \quad (3)$$

and
$$(B_b) = (F_1 + F_2)/2\gamma \quad (4)$$

provided the direction of $B_b$, $B_t$ are parallel or anti-parallel.

Evidently from equation (3), the strength of the test field which it is required to measure, is directly proportional to the difference between the frequencies $F_1$ and $F_2$. This difference may be obtained in any suitable manner, and when counted, displayed or otherwise used in convenient form, presents a value directly representative of the strength of the measured field, with an accuracy determined by the basic accuracy of the NMR measuring technique.

It will also be evident that the measured value of the test field is independent of the strength of the bias field, provided that the bias field, $B_b$, remains at all times stronger than the test field and that the construction of the instrument is such that equations (1) and (2) remain valid.

It will further be evident that for small values of the test field strength, $B_t$, the two NMR cells operate in and measure the strength of resultant fields which are of similar magnitude to that of the bias field, $B_b$, which is relatively large. Both cells therefore operate in the sensitive and accurate parts of their characteristics and give high signal-to-noise ratios.

Finally it will be evident that the test field, $B_t$, may even reverse its polarity with respect to the bias field, $B_b$, without introducing significant measuring difficulties. On reversal of the test field, the cell which had the higher resonant frequency before the reversal, adopts the lower frequency and vice versa.

BRIEF DESCRIPTION OF THE DRAWINGS

Some possible and preferred embodiments of the invention will now be described by way of example only, both in the following text and with reference to FIGS. 3 to 11 of the accompanying drawings wherein elements corresponding to those of the apparatus of FIGS. 1 and 2 are indicated by the same reference numerals as are used above, and wherein.

DETAILED DESCRIPTION OF THE PREFERRED EMBODIMENTS

Figure 3:
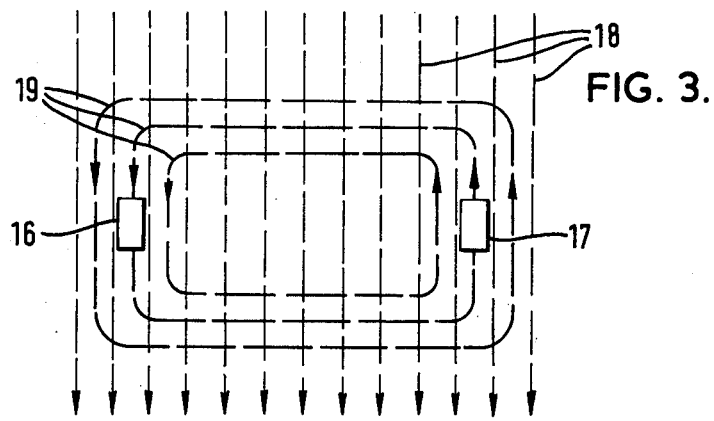
FIG. 3 illustrates schematically the nature and relative orientation of certain magnetic fields with respect to a pair of NMR cells according to a first major embodiment of the invention.

According to the first major embodiment of the invention, test and bias magnetic fields are combined at the locations of two NMR cells, as illustrated in FIG. 3, in which these two cells are indicated by reference numerals 16, 17, the parallel lines 18 with arrowheads represent the position and direction of the test field flux, and lines 19 represent the position and direction of the bias field flux. As can be seen, cell 16 experiences the sum of the bias and test field fluxes and cell 17 the difference between such fluxes.

Figure 1:
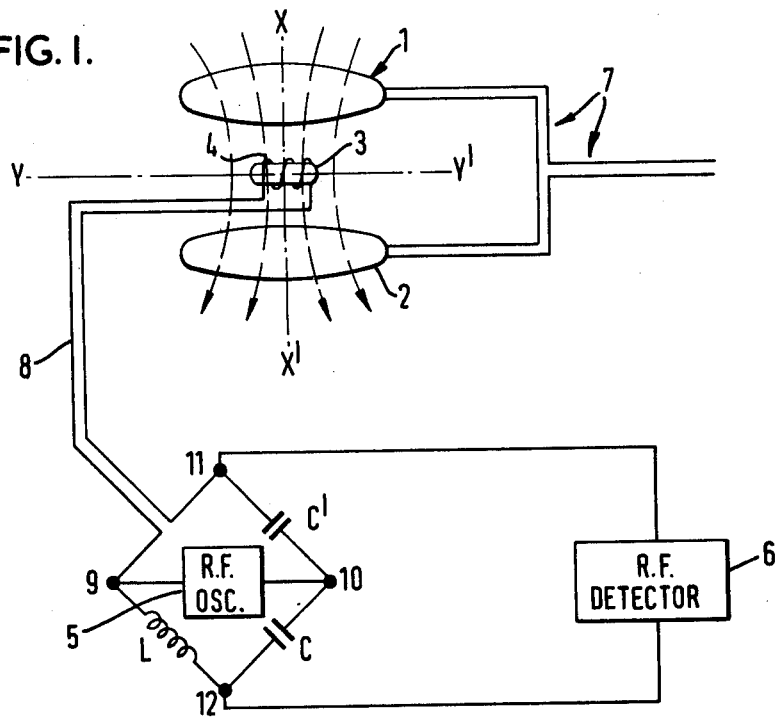
Figure 2:
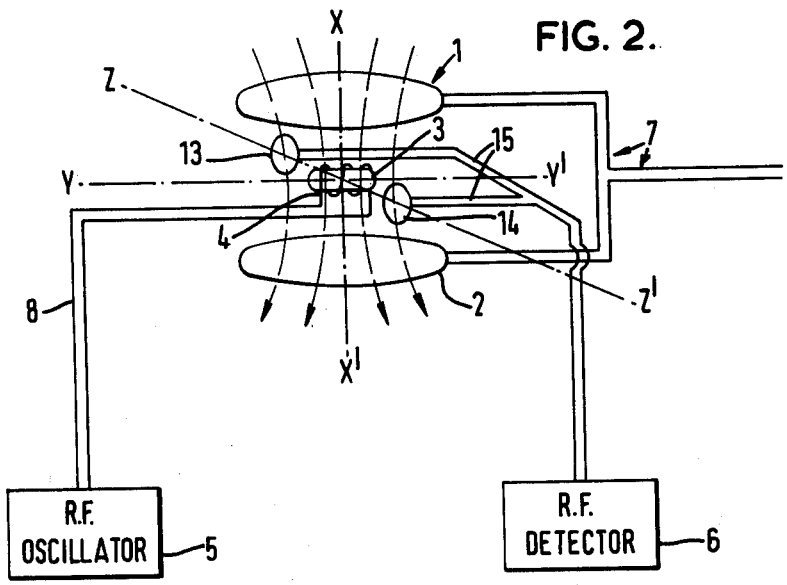
Figure 4:
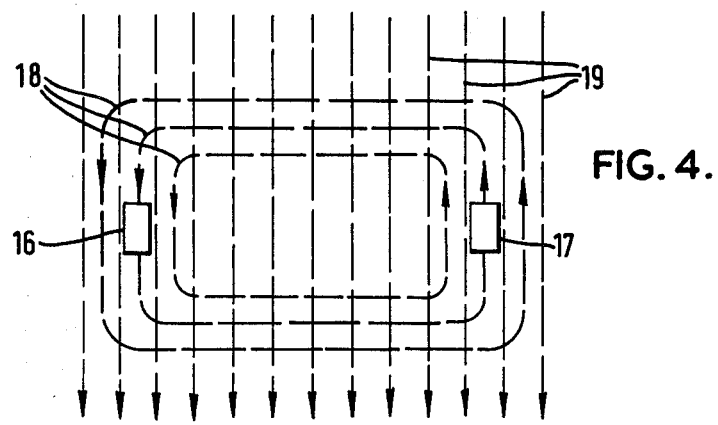
FIG. 4 is a diagram similar to FIG. 3 and illustrates another relative orientation of magnetic fields according to a second major embodiment of the invention.

According to the second major embodiment of the invention as illustrated in FIG. 4, the NMR cells, 16 and 17 are subject to a single bias field 19, and to equal opposite and parallel test fields 18. Again, cells 16 and 17 experience the sum and difference of the bias and test fields respectively. The cells 16 and 17 comprise sealed glass phials containing distilled water, as in the aforementioned known arrangements, and their Larmor frequencies are determined using assemblies according to FIG. 1 or FIG. 2, but the coils and electrical circuitry are, for the sake of clarity, omitted from FIGS. 3 and 4.

Two signals oscillating at the Larmor frequencies F1 and F2 of the cells 16 and 17 respectively and derived from the respective R.F. detectors 6 of the two resonating assemblies associated with the two cells are supplied to a circuit which will produce an output signal in accord with the difference between the frequencies F1 and F2, to provide an indication as to the magnitude of the test field, in accordance with equation (3) above.

Figure 5:
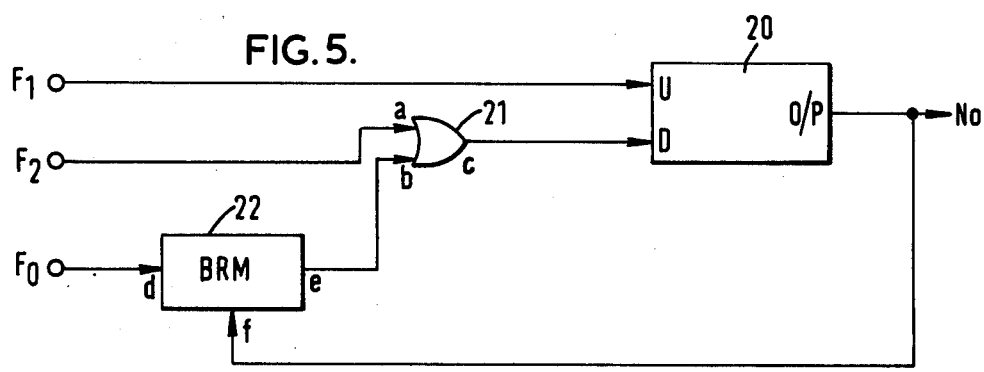
FIG. 5 illustrates schematically an electrical circuit for calculating the difference between two frequencies for use in apparatus according to the invention.

FIG. 5 illustrates a circuit suitable for measuring F1-F2 where F1 is always the greater, that is to say where the magnitude of the net magnetic flux due to the bias and test fields is always greater at cell 16 than at cell 17. Elements 20, 21 and 22 are commercially available digital logic elements with the following properties. Element 20 is an "Up/Down" Counter presenting at a plurality of output terminals O/P, of which only one is shown, a parallel binary digital coded number, which is increased in value by unity whenever an impulse is received at the "Up" terminal, U, and which is decreased in value by unity whenever an impulse is received at "Down" terminal, D. Element 21 is an "Or" gate in which an impulse is generated at terminal, C, whenever an impulse is received either at terminal "a" or at terminal, "b". Element 22 is a binary rate multiplier, which on being fed with a train of impulses of frequency Fo impulses/sec at terminal d, and a parallel binary digital coded number, No, at terminal(s), f, produces a train of impulses of frequency (Fo × No/k) impulses/sec. at terminal e, where k is a system design constant.

A train of impulses at the higher frequency, F1, is fed to the terminal, U, of counter 20. A similar impulse train at the lower frequency, F2, is fed to terminal a of the "OR" gate 21. A third train of impulses, generated externally at a constant frequency Fo, greater than F1, is fed to terminal d of multiplier 22. The output number No of counter 20 is fed back to terminal f of multiplier 22.

Under steady state conditions, No is constant, therefore the trains of impulses at terminals U and D have identical frequencies. By inspection, $$F1 = F2 + Fo \cdot No/k$$

whence $Fo \cdot No/k = (F1-F2)$
The number No is therefore directly proportional to the required frequency difference F1-F2.

Figure 6:
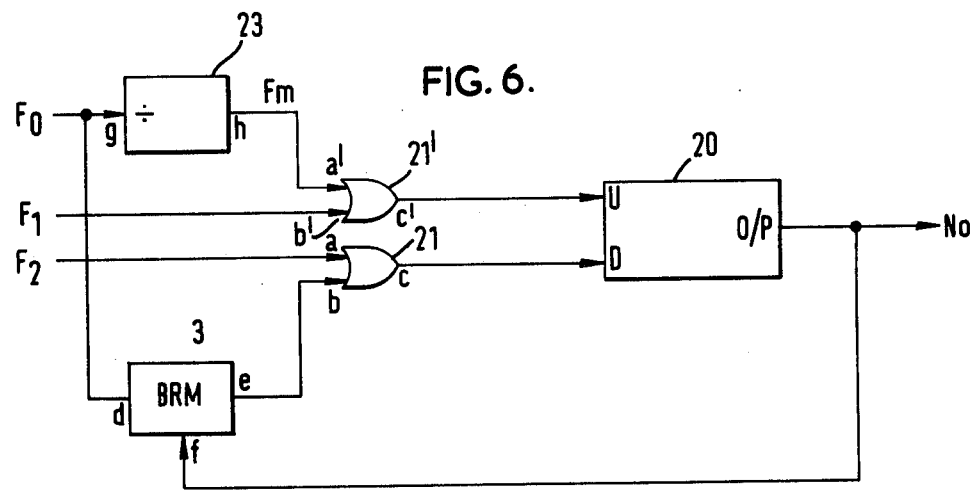
FIG. 6 illustrates schematically another electrical circuit for calculating the difference between two frequencies for use in apparatus according to the invention.

If the test field is reversible, relative to the bias field, that is, if it is possible that cell 16 will experience the difference between, rather than the sum of the bias and test fields, and vice versa in respect of cell 17 then (F1-F2) may have variable sign. FIG. 6 illustrates an electric circuit which is applicable in these circumstances to produce an output signal denoting not only the absolute magnitude or modulus of the difference (F1-F2) but also the sign, thereby indicating the relative magnitudes of F1 and F2, that is, which cell has the higher (or lower) resonant frequency, and accordingly the instantaneous polarity or direction of the test field with respect to the bias field.

To produce the apparatus of FIG. 6, that of FIG. 5 is modified by the addition of frequency divider, 23 which on receiving a train of impulses of frequency Fo at terminal g generates at terminal h a train of impulses of frequency Fm where Fm < Fo. This train of pulses passes to input terminal $a'$ of a further OR gate 21', whose other input terminal $b'$ receives the impulses at frequency F1, and whose output terminal $C'$ is connected to the UP terminal U of the UP/DOWN counter. Let the frequency Fm be chosen to be greater than the greatest absolute magnitude, or modulus of the frequency difference, F1-F2.

By analogy from FIG. 5, $$(Fo \cdot No/k = (F1 + Fm - F2) = (F1 - F2) + Fm$$

By definition, this number is always positive. By suitable choice of circuit constants, the digital number No may be made to represent the magnitude of the frequency difference, F1-F2, with a leading bit which is either a logic "1" or logic "0", according to the sign of the frequency difference.

The strength of the magneto-motive force (MMF) generated by a conductor carrying an electric current is directly proportional to the said current. If the MMF is generated in a magnetic circuit, substantially composed of air or other medium with constant magnetic permeability, a magnetic flux flows in the said magnetic circuit which is directly proportional to the MMF and hence to the electric current producing the MMF.

Accordingly, having given the basic theory underlying the present invention, and described two alternative methods of applying the sum and difference of the magnetic test and bias fields to the two NMR cells, (FIGS. 3 and 4) and two circuits for calculating the difference between the two resonant frequencies of the cells (FIGS. 5 and 6), there now follows a description, with reference to FIGS. 7 to 11, of some particular arrangements, in accordance with the embodiment of FIG. 4, for producing the bias and test magnetic fields, the test field being generated by an electric current flowing in a coil system of fixed geometry located in fixed spatial relationship to the NMR cells and the bias field. From the foregoing description, it will be evident that this embodiment of the invention may be used to determine accurately the strength of the electric current flowing in the coil system.

In the preamble to this description, the phenomenon of nuclear magnetic resonance was described with regard to the behaviour of a single isolated nucleus. Practical instruments utilize the behavior of an ensemble or aggregate of nuclei occupying a finite volume of space. It will be obvious without lengthy analysis, that to obtain the sharpest resonance, it is important that all nuclei in the said volume experience as nearly as possible the same magnetic field strength. To obtain this desirable homogeneity of magnetic field over the whole volume of the NMR cells, careful design of the coil system is required.

Figure 7:
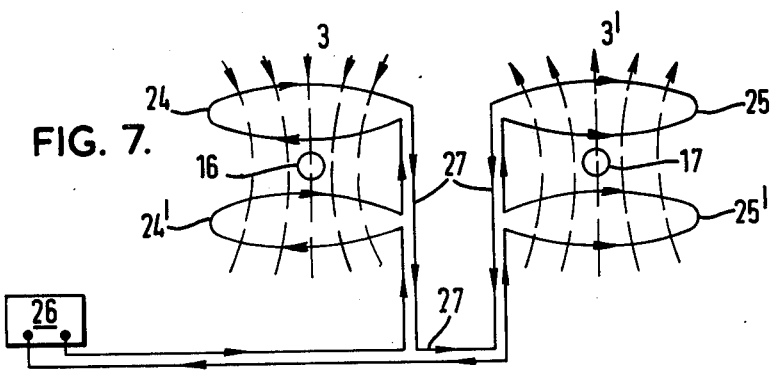
FIG. 7 illustrates an arrangement of coils for producing test magnetic fields from an electrical current to be measured.

With reference to FIG. 7, the test field coil system consists, in one embodiment, of two pairs of Helmholtz coils. The two plane circular coils, 24 and 24' of negligible cross-section from a magnetic point of view, are mounted parallel to each other and surround symmetrically an NMR cell 16. A second pair, 25-25' are similarly disposed in relation to a second NMR cell 17. The two pairs of coils are connected in series with each other and with a source 26 of electric current by paired conductors 27, which carrying equal currents in opposite directions generate a negligible external magnetic field. By choice of appropriate dimensions, magnetic fields 3 and 3', which act in opposite directions, may be generated so as to have high homogeneity over the volumes of the NMR cells, 16 and 17, respectively.

The otherwise constant ratio between the strength of the circulating electric current and the strength of the generated magnetic field, may deviate from constancy if the dimensions of the coil system are allowed to vary. In particular, an uncorrected increase in the diameter of the coils 24, 24', 25, 25' due to thermal expansion will reduce the field strength generated at the location of the NMR cells by a given electric current. This potential defect of the system is alleviated in another variant of the previous embodiment by means illustrated in FIG. 8. Helmholtz coils 24 and 24' shown in cross-section, are supported by non-magnetic struts 28, and frame 29 surrounding the NMR cell 16. The coils, struts and frame, though electrically isolated from one another, are in close thermal contact and adopt approximately the same steady state temperature. By correct choice of materials of different coefficients of linear thermal expansion, it is possible to ensure that an increase in temperature of the assembly causes an increase in the diameters of coils 24 and 24', and a simultaneous decrease in their separation, as shown in broken lines in FIG. 8 to an exaggerated scale. Typically, coils 24 and 24' may be made of copper, and the struts 28, and frame 29 of aluminium or titanium. By careful choice of dimensions, the increase in field strength at 16, occasioned by the decrease in coil separation may be made substantially to compensate for the reduction in field strength due to the increase in coil diameters, at least for a range of temperatures corresponding to the working temperature range of the instrument. The coils 25 and 25' may be mounted in a similar manner.

Figure 8:
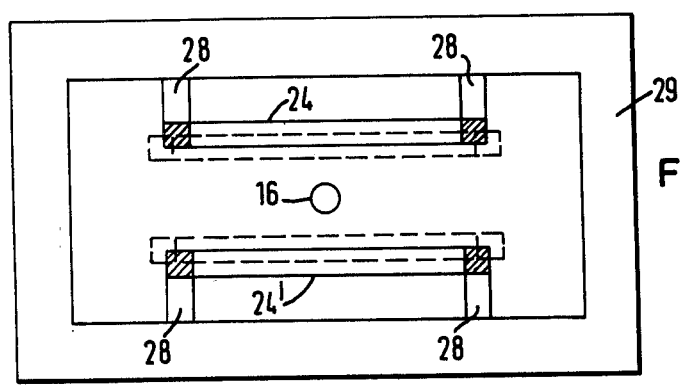
FIG. 8 illustrates an arrangement for the mounting of a pair of coils for reducing the effect of temperature variations on the magnetic flux density at a point between the coils.

In the embodiments of FIGS. 7 and 8 as described above, the test field is generated by a single coil system, carrying a single current. However, multiple coil systems, carrying either the same current or different currents may be used for special purposes. For example, another variant of the previously described embodiment is illustrated diagrammatically in FIG. 9 which shows in cross-section, an NMR cell 16, surrounded by two symmetrically disposed Helmholtz coil pairs, 24-24' and 30-30' respectively. The other NMR cell 17 (not illustrated in FIG. 9) is also surrounded by two Helmholtz coil pairs 25-25' and 31-31' in a similar manner.

Let us assume that a current Io amperes, flowing in a notional single-turn Helmholtz coil system (not shown) of arbitrarily chosen dimensions, produces a field of strength Bo Gauss at the cell 16. Further let the same field strength, Bo, be produced, either by a current $I_1$ amperes, flowing in coil system 24-24' or by a current, $I_2$ amperes, flowing in the coil system 30-30'. Let us further define two constants, K1, K2, such that $$Io/I1 = K1 \text{ and } Io/I2 = K2$$

Then by definition, the instantaneous field strength, Bt, measured at the cell, 16 is $$Bt = (i_1 K_1 + i_2 K_2) Bo/2Io \tag{5}$$

where $i_1$, $i_2$ are the instantaneous values in amperes of the currents flowing in coil systems 1-1' and 2-2' respectively.

Figure 9:
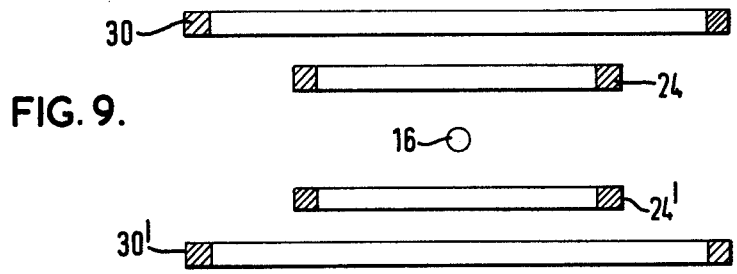
FIG. 9 illustrates a further arrangement of coils for producing a test magnetic field.

A commonly recurring problem in electrotechnical metrology is the precision measurement of the ratio between two currents. In one application of the embodiment of the invention as illustrated in FIG. 9 and as hereinbefore described, the apparatus is required to produce a current, $_2$ amperes having a precisely determined ratio to a measured current, $i_1$ amperes. To this end, the measured current, $i_1$ is caused to flow in coil systems 24-24' and in coil system 25-25' and a second current, $i_2$ produced by an auxiliary current source flows in coil system 30-30' and in coil system 31-31'. The auxiliary current source is controlled by a signal derived from the apparatus as previously described in accord with the instantaneous magnitude of the test field, and controls the current $i_2$ in sign and magnitude to reduce the measured test fields at cells 16 and 17 to zero. When this condition is reached cells 16 and 17 resonate at the same frequency since they experience equal magnetic flux, due to the bias field alone. Under conditions of balance, from equation (5), $$Bt = (i_1 K_1 + i_2 K_2) Bo/2Io \tag{6}$$

whence $i_2 = -i_1 K_1/K_2$ The current $i_2$ from the auxiliary source is therefore maintained with a precision determined by the instrument at a constant ratio, $-k_1/k_2$, to the measured current, $i_1$.

In an alternative application of this embodiment, the coil systems 24-24' and 30-30' are coupled to carry the same test current to be measured but to generate opposing fields. The coil systems 25-25' and 31-31' similarly carry the same test current but generate opposite fields, the overall test field at cell 17 acting, as before, in the opposite direction to that at cell 16. Using the same symbols as the previous example we have $$i_2 = -i_1$$

and $$Bt = i_1 (k_1 - k_2) Bo/2Io \tag{7}$$

By design, the ratio $(k_1 - k_2) Bo/2Io$, which is a function of the dimensions and positions of the Helmholtz coils, may be made as small as desired. For very heavy currents, where the MMF generated by even a single turn coil may be so large as to be outside the range of measurable values of Bt this coil arrangement enables the instrument designer to produce a proportional test field at the NMR cells having a constant ratio equivalent to that which would be produced by a coil with a fractional turn if this were physically feasible.

As mentioned previously, maintenance of the homogeneity of the field over the volume of the NMR cells is extremely important. This constraint applies equally to the design of the bias field system, which in general must contain the test field system, albeit with slightly reduced demands as regards constancy of the generated field strength.

The said bias field may be generated by means of a so-called Watson magnet, of which a theoretical analysis and description is given in the "Proceedings of the International Conference on Magnet Technology, Oxford, 1967, pp 129 to 134".

Figure 10:
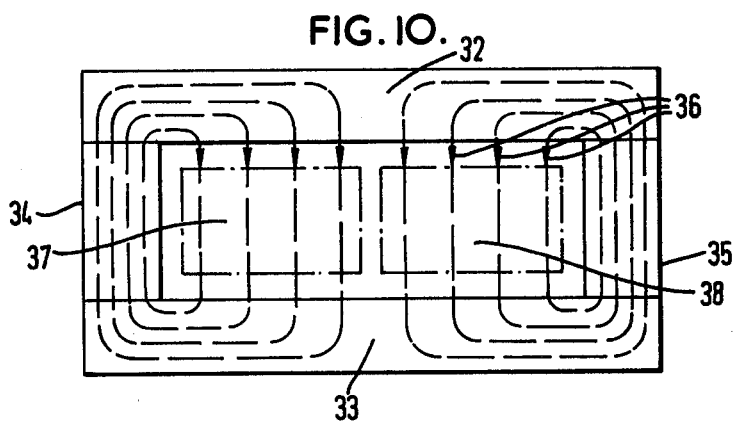
FIG. 10 illustrates a form of magnet for producing a bias magnetic field.
Figure 11:
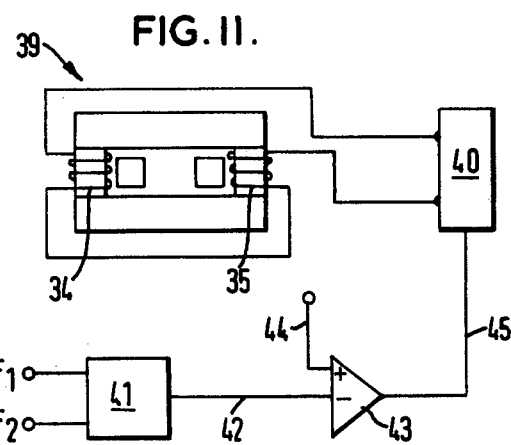
FIG. 11 illustrates an arrangement for the stabilisation of a bias magnetic field.

FIG. 10 is a cross-sectional view of a typical Watson magnet. Parallel, plane ferrous pole pieces, 32 and 33 are supported and separated at their outer edges by bar magnets 34 and 35 which may be permanent magnets, as shown, or electromagnets. Magnets 34 and 35 have like poles in contact with the same pole pieces such that the air space between pole pieces 32 and 33 and within the volume bounded by magnets, 34 and 35 forms part of the magnetic circuit. It can be shown (loc.cit) that the magnetic flux 36, within this space is very homogeneous over a large volume of space which may be made large enough to contain two NMR cells with their test field coil systems side-by-side as indicated by the chain-dotted enclosures 37, 38 in the diagram.

The Watson magnet, while not in itself forming an essential part of the invention, is cited here as typical of the preferred constructional techniques which serve to optimise the performance of the invention.

The bias field excitation system may use permanent magnets or electromagnets or a combination of both. Provided the total reluctances of the magnetic circuits through each NMR cell are identical, the difference between the measured resonant frequencies of the two NMR cells will be independent of the strength of the bias field, as indicated by equation (3) above. In a practical instrument, however constructional tolerances will combine to cause minute but measurable differences between the properties of these two magnetic circuits. This will introduce into equation (3) an additional term dependent at second or higher order on the strength of the bias field.

In another embodiment of the invention, intended to minimise this source of error, the two NMR cell assemblies are made as closely similar as possible and mounted in a bias field excitation system in which at least part of the MMF is generated by electromagnets. The arrangement is illustrated diagramatically in FIG. 11. The two cell assemblies including the NMR cells 16, 17 and their test field and excitation coils are disposed within a Watson magnet 39 incorporating electro magnets 34, 35 supplied from a controllable power supply 40. Additional means indicated generally at 41 are provided for generating a signal on output line 42 in accord with the sum of the resonant frequencies $F_1$, $F_2$ of the two NMR cells 16 and 17. This signal is compared, for example in a differential amplifier 43 with a constant reference signal supplied on input line 44 and any deviation between the two produces a signal on output line 45 of the amplifier 43, which signal is coupled to a control input of supply 40 to modify the bias field by means of the electromagnets 34, 35, to restore the deviation of the frequency sum signal from its reference value substantially to zero. It will be clear from equation (4) above, that this arrangement will result in maintaining the bias field strength, Bb, sensibly constant. The bias field strength as stabilised is the average of the bias field strengths at each cell, and is virtually independent of hysteresis effects or changes in permeability of the pole pieces or changes in any other magnetic properties of the bias field system.

Since the difference in resonant frequencies of the two NMR cells is, as noted, substantially independent of the strength of the bias field, a common bias field excitation system may be used for two or more instruments which may operate in close proximity, provided adequate provision is made for avoiding interference between the test field coil systems of the individual instruments.

All the foregoing description with reference to FIGS. 7 to 11 has been concerned with summation of the bias and test fields in accordance with FIG. 4 and in particular to the case of test fields generated by an electric current flowing in a test field coil system.

In some instances, as for example in geomagnetic survey work, the test field may already exist, with inhomogeneities which are negligible within the limits of the dimensions of the measuring apparatus. For such cases, the field summation geometry of FIG. 3 is more applicable, and the coil arrangement of FIG. 7 may be used to generate equal and opposite fixed bias fields, rather than test fields.

I claim:

1. Apparatus for measuring magnetic field strength, comprising: two Nuclear Magnetic Resonance cells (the NMR cells) each containing material having identical gyromagnetic properties as the other; field generating means for applying simultaneously to both said NMR cells bias magnetic field which is parallel and of substantially equal strength at each NMR cell, such that when the NMR cells further simultaneously receive test magnetic field which is of substantially equal strength at each NMR cell, and which is parallel to, and at one NMR cell is in the same direction, and at the other NMR cell is in the opposite direction to, the bias field at said respective NMR cells, resultant magnetic fields of strengths equal to the sum and difference of the strengths of the bias and test fields will be experienced simultaneously by said one and said other NMR cell respectively; means for individually magnetically exciting each NMR cell only at its own precise Larmor precession, or resonance frequency as determined by said gyromagnetic properties and by the magnitude of the resultant magnetic field strength at that NMR cell; and means for deriving a resultant signal in accord with the difference between the Larmor frequencies of the two NMR cells, said resultant signal being representative of the magnitude of said test magnetic field.

2. Apparatus according to claim 1, wherein means are provided for detecting and indicating the relative magnitude of the said Larmor frequencies of the two NMR cells, and hence for indicating the instantaneous polarity of the test magnetic field with respect to the bias field at each NMR cell.

3. Apparatus according to claim 1 wherein said field generating means is adapted to apply bias magnetic field which is equal in strength and opposite in sense at the respective NMR cells, which accordingly will experience said resultant magnetic field when mounted in test field whose sense is the same at both cells.

4. Apparatus according to claim 1 wherein said field generating means is adapted to apply bias magnetic field which is equal in strength and is of the same sense at the respective NMR cells which accordingly will experience said resultant magnetic fields when mounted in test field acting in opposite senses at the two NMR cells.

5. Apparatus according to claim 1 including a coil system for generating the test field from an electric current to be measured.

6. Apparatus according to claim 5 wherein the test field coil system comprises two pairs of Helmholtz coils, each pair being arranged with its coils coaxially mounted and axially spaced about a respective one of the NMR cells.

7. Apparatus according to claim 1 and including two or more independent coil systems for carrying the same or different electric currents to generate the test field, each of the coil systems comprising two pairs of Helmholtz coils, one for each NMR cell, the coil pairs associated with each respective NMR cell being arranged coaxially, with the coils separated axially, about said NMR cell.

8. Apparatus according to claim 6 including a mounting assembly for the Helmholtz coils said coil system and mounting assembly being constructed and arranged such that changes in the test field strength at the NMR cells caused by an increase in the diameter of the test field coils due to thermal expansion is at least partly compensated by an opposing change in field strength caused by a displacement of the coils relative to the NMR cells due to thermal expansion in the mounting assembly.

9. Apparatus according to claim 4 wherein the field generating means includes a Watson magnet.

10. Apparatus according to claim 1 wherein the field generating means is constructed to excite the bias field at least in part electromagnetically.

11. Apparatus according to claim 10 and including means for deriving a frequency sum signal in accord with the sum of the resonant frequencies of the two NMR cells, and means for controlling the electromagnetic excitation of the bias field in accord with said frequency sum signal.

12. Apparatus according to claim 1 wherein the field generating means is constructed to excite the bias field at least partly by permanent magnets.

13. Apparatus according to claim 1 wherein two or more instruments, each including a pair of said NMR cells and associated coil systems for generating the test fields, share a common bias field generating means.

14. Apparatus according to claim 3 wherein the bias field generating means comprises a coil system comprising two pairs of Helmholtz coils, each pair being associated with a respective one of the NMR cells.

15. A method of measuring magnetic field strength comprising applying simultaneously to each of two Nuclear Magnetic Resonance cells (the NMR cells), each of which contains material having identical gyromagnetic properties as the other, bias magnetic field which is parallel and of substantially equal strength at each NMR cell; subjecting both NMR cells simultaneously to test magnetic field which is of substantially equal strength at each NMR cell and which is parallel to, and at one NMR cell is in the same direction, and at the other NMR cell is in the opposite direction to, the bias field at said respective NMR cells such that resultant magnetic field strengths equal to the sum and difference of the strengths of the bias and test fields are experienced simultaneously by said one and said other NMR cell respectively; individually magnetically exciting each NMR cell only at its own precise Larmor precession or resonance frequency as determined by said gyromagnetic properties and by the magnitude of the respective resultant magnetic field strength at that NMR cell; and deriving a resultant signal in accord with the difference between the Larmor frequencies of the two NMR cells, said resultant signal being representative of the magnitude of said test magnetic field.

16. A method according to claim 16 in which magnetically exciting each NMR cell as aforesaid includes producing two electrical signals, each oscillating at a respective one of said precise Larmor precession or resonance frequencies and in which said electrical signals are fed to respective inputs of a logic circuit which produces said difference signal.

17. A method according to claim 16 in which the bias magnetic field applied to one of said NMR cells is opposite in sense to the bias magnetic field applied to the other of said NMR cells, and in which the test magnetic field is in the same direction at each of said NMR cells.

18. A method according to claim 16 in which the test magnetic field is produced by causing a test electrical current to flow through a system of coils so that said test magnetic field is opposite in sense at one of said NMR cells to said test magnetic field at the other of said NMR cells, and in which the bias magnetic field is in the same direction at each of said NMR cells.

* * * * *